(12) United States Patent
Takada et al.

(10) Patent No.: US 6,530,420 B1
(45) Date of Patent: Mar. 11, 2003

(54) HEAT CARRIER

(75) Inventors: Tomohito Takada, Oizumi-machi (JP); Naoki Hiro, Osaka (JP); Yasushi Yamamoto, Hirakata (JP); Katsuyoshi Oki, Ota (JP); Kenji Nasako, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/662,330

(22) Filed: Sep. 14, 2000

(30) Foreign Application Priority Data

Sep. 17, 1999 (JP) .......................... 11-263505
Nov. 19, 1999 (JP) .......................... 11-329974
Dec. 15, 1999 (JP) .......................... 11-355898

(51) Int. Cl.⁷ ............................................. F28D 15/00
(52) U.S. Cl. ........................ 165/104.33; 165/104.26; 165/80.4; 361/700
(58) Field of Search .............. 165/104.26, 104.33, 165/80.4, 185; 361/699, 700; 257/715; 174/15.2

(56) References Cited

U.S. PATENT DOCUMENTS

| | | | | |
|---|---|---|---|---|
| 4,138,692 A | * | 2/1979 | Meeker et al. ............. 165/80.4 |
| 4,509,590 A | * | 4/1985 | Svetlik .................. 165/104.33 |
| 5,203,399 A | * | 4/1993 | Koizumi ................ 165/104.33 |
| 5,219,020 A | * | 6/1993 | Akachi .................. 165/104.26 |
| 5,320,167 A | * | 6/1994 | Johnson et al. ................ 165/64 |
| 5,381,859 A | * | 1/1995 | Minakami et al. ......... 165/80.3 |
| 5,405,533 A | * | 4/1995 | Halebeck et al. ........... 210/634 |
| 5,660,229 A | * | 8/1997 | Lee et al. .............. 165/104.26 |
| 5,998,863 A | * | 12/1999 | Kobayashi et al. ......... 257/715 |
| 6,016,251 A | * | 1/2000 | Koide et al. ............... 165/80.4 |
| 6,055,154 A | * | 4/2000 | Azar ...................... 165/104.33 |
| 6,109,337 A | * | 8/2000 | Gomez .................... 165/104.33 |
| 6,111,749 A | * | 8/2000 | Lamb et al. ................. 361/699 |
| 6,205,803 B1 | * | 3/2001 | Scaringe ................. 165/104.33 |
| 6,269,865 B1 | * | 8/2001 | Huang .................... 165/104.26 |

* cited by examiner

Primary Examiner—Henry Bennett
Assistant Examiner—Terrell McKinnon
(74) Attorney, Agent, or Firm—Armstrong Westerman & Hattori, LLP

(57) ABSTRACT

A heat carrier comprises a closed or looped heat pipe having a heat receiving section and a heat radiating section, and accommodating therein a heating medium such as carbon dioxide, which becomes a low-viscous supercritical fluid when it is heated. The supercritical fluid is circulated in the heat pipe by convection due to a density difference based on a temperature difference between the heat receiving section and the heat radiating section, thereby carrying heat from the heat receiving section to the heat radiating section.

13 Claims, 9 Drawing Sheets

HEAT CARRIER

FIELD OF THE INVENTION

The invention relates to a heat carrier for carrying the heat, received at a heat receiving section of the carrier, to a heat radiating section of the carrier by means of a heating medium.

BACKGROUND OF THE INVENTION

A typical cooling unit for cooling a heat generating element such as an MPU of a portable personal computer (PC) is disclosed in, for example, Japanese Patent Publication No. 8-303970, which utilizes a heat pipe including therein Wick structure which comprises a multiplicity of fine wires for accommodating a working fluid or heating medium such as water.

In the heat pipe disclosed in the publication, the heating medium evaporates in the heat receiving section (heat generating section) of the heat pipe. The vapor thus generated carries or transports the heat to a heat radiating section, where the heating medium is cooled by liberating the heat and transformed to the liquid state before it is returned to the heat receiving section via the Wick structures, thereby continually carrying heat from the heat receiving section to the heat radiating section, cooling the heat generating section.

Because the heat pipe includes a Wick structure inside it for carrying the working fluid, it cannot be manufactured in a compact form. Hence, if such a heat pipe as mentioned above is employed in an electronic apparatus, the apparatus must become disadvantageously large.

Another type of ecologically safe heating medium in the form of super critical fluid is disclosed in Japanese Patent Publication No. 7-253254.

However, the technology disclosed in this publication is a large system for an air conditioner, and involves a gas pump for circulating a supercritical heating medium between two heat exchangers, one absorbing heat and another radiating heat. Thus, the system is too large to use in electronic apparatuses.

SUMMARY OF THE INVENTION

The invention is directed to overcome the foregoing problems by providing a compact heat carrier by using only thin heat pipes but not using conventional thick heat pipes or a pump which makes the size of a heat carrier very large. The invention is also directed to provide a compact heat carrier for use in a compact electronic devices such as a portable PC.

In one aspect, a heat carrier of the invention comprises a closed container having at least one heat receiving section and at least one heat radiating section, and accommodating therein a heating medium, wherein said heating medium is transformed into a supercritical fluid as it is heated in said heat receiving section and gets circulated by convection to carry heat from said heat receiving section to said heat radiating section due to a difference in density based on temperature difference between said heat receiving section and said heat radiating section.

In this arrangement, since the heating medium has a low viscosity in its supercritical state, it requires only a little energy for circulation, thereby enabling manufacture of a compact yet efficient heat carrier.

The closed container may be constructed in the form of a rectangular parallelepiped or a cylinder to facilitate convective circulation of the heating medium within the container.

However, the container is preferably a looped heat pipe connecting the heat receiving section and the heat radiating section, which facilitates smooth flow of the heating medium through the pipe.

The looped heat pipe may be provided with an upward bend which facilitates thermal convection of the heating medium under the influence of the gravitational force.

Covering the entire pipe with a heat insulator, except the heat receiving and radiation sections, will result in enhanced or more efficient circulation of the heating medium, providing better heat transfer from the heat receiving section to the heat radiating section.

The looped heat pipe may be configured to run in zigzags several times between the heat receiving section and the heat radiating section, in place of several pipes connecting the two sections as in conventional heat carrier. This will alleviate burden of filling a heating medium in many pipes.

By installing a multiplicity of down-sized heat radiating sections in the looped heat pipe, an amount of heat to be liberated from each radiating section is reduced, thereby minimizing the dimensions of each radiating section, so that they can be installed in smaller spaces. This is a benefit of the invention especially in down-sizing PCs.

On the other hand, a common heat radiating section can be connected to a multiplicity of heat receiving sections in a looped heat pipe for minimization of space for the heat radiating section and for cutting the cost of the heat carrier.

A portion of the looped heat pipe can be a planar mesh adapted to serve as a heat receiving section, which is suitable for example for a printed circuit board.

In this case, by making the diameter of each pipe smaller than the rest of the heat pipe, heat transfer between the heat receiving section and the heat radiating section may be desirably balanced. This type of heat carrier can be suitably used in a compact light-weight portable PC for example.

A sufficient length of the heat pipe in the heat receiving section may be disposed along the periphery of an object that includes the heat receiving section, thereby allowing efficient heat removal for the apparatus.

Since carbon dioxide advantageously becomes supercritical state at a pressure of 7.3 MPa and a temperature of about 31° C., it can be suitably used in cooling an electronic appliance such as a PC which contains elements that generates heat and rises in temperature as high as 80° C. if not cooled.

BRIEF DESCRIPTION OF THE DRAWINGS

FIG. 13 showing another instance where the printed circuit board includes a single heat generating element and a multiplicity of heat radiating sections; and FIG. 14 showing a further instance in which the entire printed circuit board is utilized as a heat receiving section.

DETAILED DESCRIPTION OF THE PREFERRED EMBODIMENT

Figure 1:
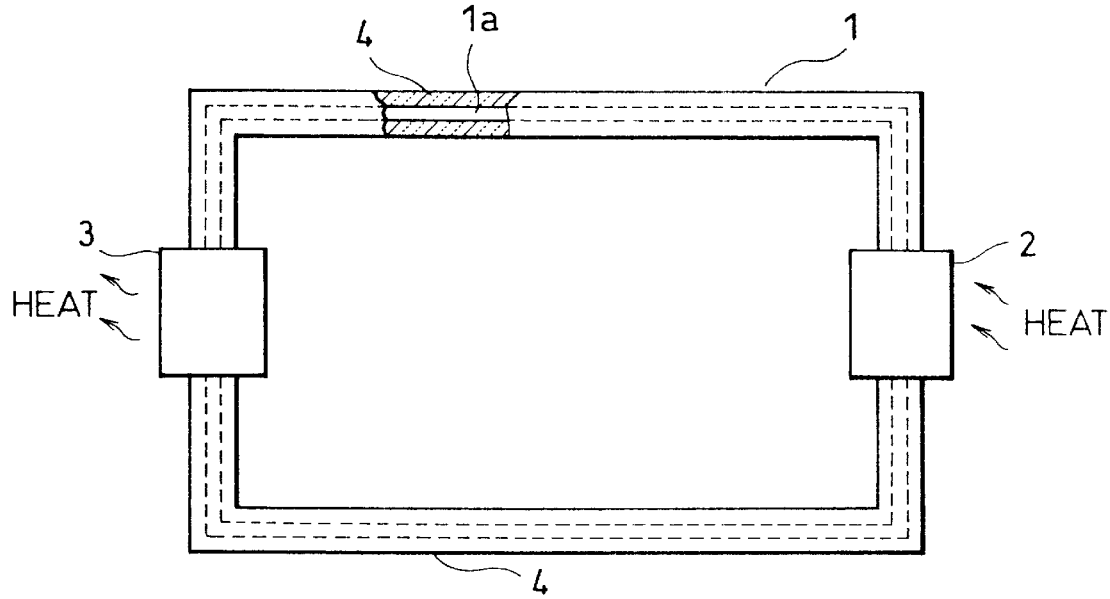
FIG. 1 illustrates a basic structure of a first heat carrier according to the invention.

Referring now to FIG. 1, there is shown a heat carrier according to the invention, which includes a looped heat pipe 1 passing through a heat receiving section 2 and a heat radiating section 3 of the heat carrier. The looped heat pipe 1 is entirely covered with a thermal insulation layer 4 except for the portions of the pipe in the heat receiving section 2 and the heat radiating section 3. Enclosed in the space inside the looped heat pipe 1 is carbon dioxide to serve as a heating medium.

Carbon dioxide in the looped heat pipe 1 becomes a very convective low-viscous supercritical fluid at and above a pressure of 7.3 MPa and a temperature of about 31° C. As a temperature gradient is created in the supercritical fluid in the looped heat pipe 1, it therefore creates a density gradient, which causes the fluid to undergo natural convection without any external drive means, thereby transporting heat from the heat receiving section 2 to the heat radiating section 3 while circulating through the looped heat pipe 1.

Figure 2:
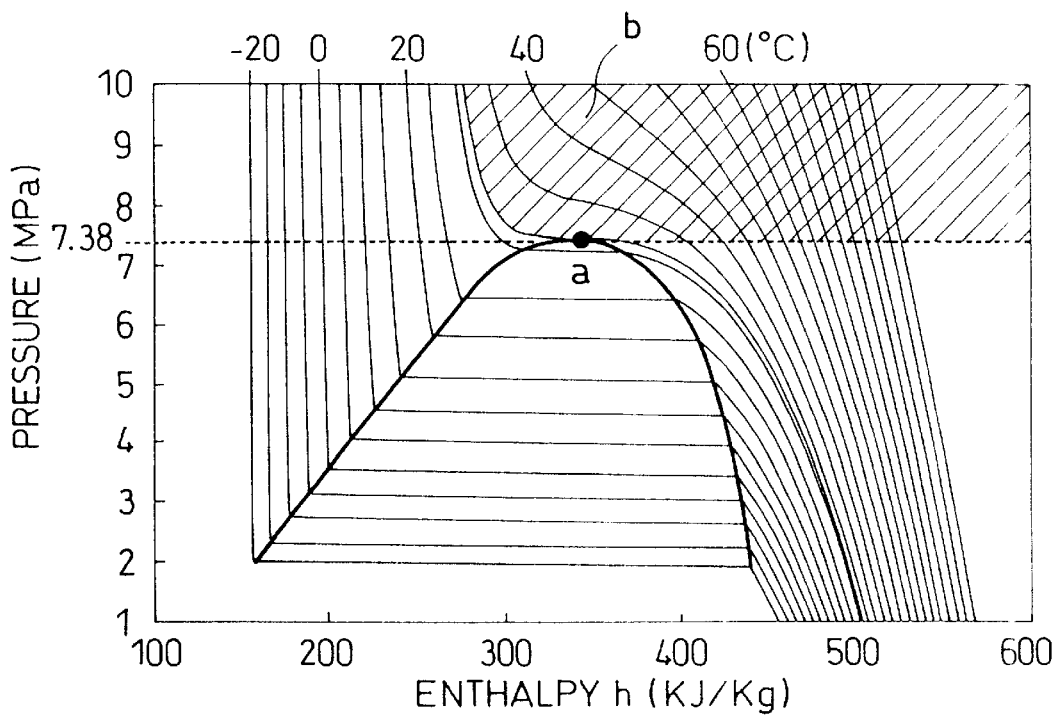
FIG. 2 is a Mollier diagram of carbon dioxide.

Supercritical fluid is a fluid in a thermodynamic state which differs from a liquid state or gaseous state realized at and above a critical point of the fluid material. Carbon dioxide has a critical point at a pressure of 7.3 MPa and a temperature of about 31° C., which is indicated by point "a" in FIG. 2. Thus, carbon dioxide becomes supercritical in the region b characterized by hatching.

The following table shows critical temperatures and pressures for different materials including carbon dioxide.

TABLE I

| MATERIAL | CRITICAL TEMPERATURE (° C.) | CRITICAL PRESSURE (MPa) |
|---|---|---|
| AIR | −141.15 | 3.77 |
| CARBON DIOXIDE | 31.05 | 3.78 |
| HYDROCHLORIDE | 51.45 | 8.31 |
| WATER | 374.15 | 22.3 |
| NITROGEN | −146.95 | 3.39 |
| OXYGEN | −118.55 | 5.50 |

It is seen in the table above that carbon dioxide has an appropriate critical point, as compared with other materials, for use as a heating medium in such heat carriers as mentioned above. However, it should be clear that the heating medium of the invention is not limited to carbon dioxide and any other suitable material may be used depending on the purpose of the heat carrier.

It is noted that carbon dioxide has a density and a thermal conductivity similar to that of a liquid and a viscosity similar to that of a gas, as shown in TABLE II.

TABLE II

| PROPERTY | GAS | LIQUID | DENSITY OF SUPER-CRITICAL FLUID |
|---|---|---|---|
| DENSITY ($Kg/m^3m^3$) | 0.6–1 | 1000 | 200–900 |
| VISCOSITY ($Pa \cdot S$) | $10^{-5}$ | $10^{-3}$ | $10^{-5}$–$10^{-4}$ |
| DIFFUSION COEFFICIENT ($m^2/S$) | $10^{-5}$ | $<10^{-9}$ | $10^{-7}$–$10^{-8}$ |
| THERMAL CONDUCTIVITY (W/mK) | $10^{-3}$ | $10^{-1}$ | $10^{-3}$–$10^{-1}$ |

It is seen from TABLE II that supercritical fluids generally have the following characteristics:

(1) Mobility is high due to low viscosity; and (2) Kinematic viscosity is relatively low as compared with liquids and gases so that convection can take place easily.

Figure 3A:
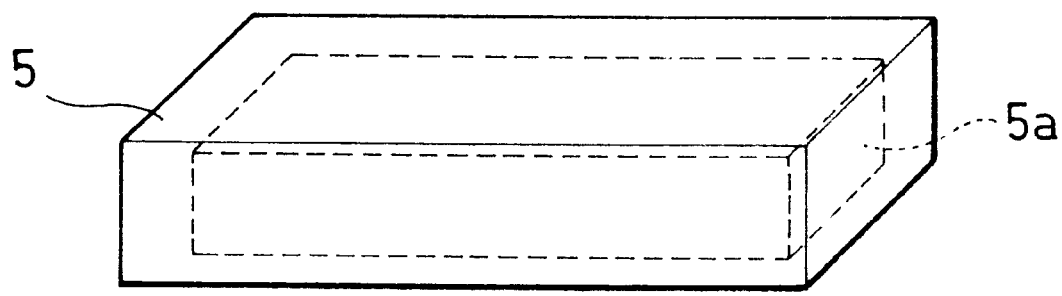
FIG. 3 illustrates a basic structure of a second heat carrier according to the invention.
Figure 3B:
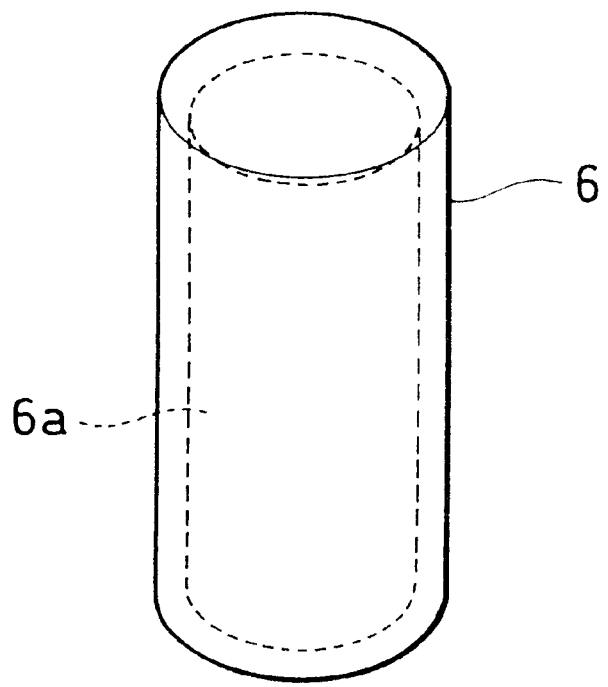

Although the inventive container of the heat carrier for accommodating a heating medium has been described above in the form of a looped heat pipe in conjunction with FIG. 1, the container of the invention is not limited to such a looped heat pipe. For example, the container can be a simply closed rectangular parallelepiped container 5 or a simply closed cylinder 6 having no closed loop inside thereof, as shown in FIG. 3.

Figure 4A:
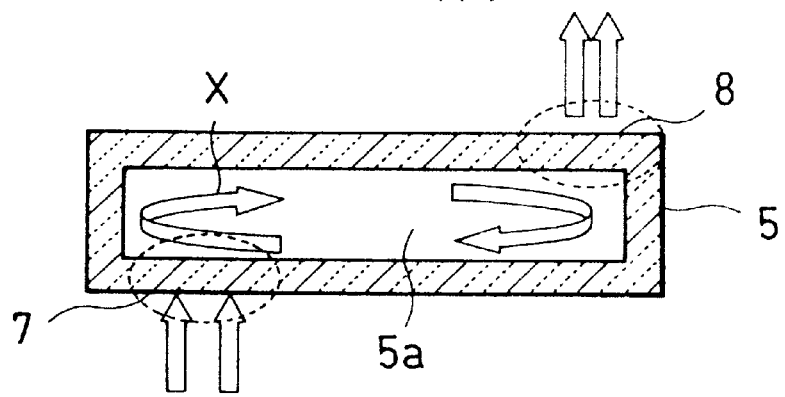
FIG. 4 depicts convection of a heating medium in a heat pipe as the heat carrier shown in FIG. 3.
Figure 4B:
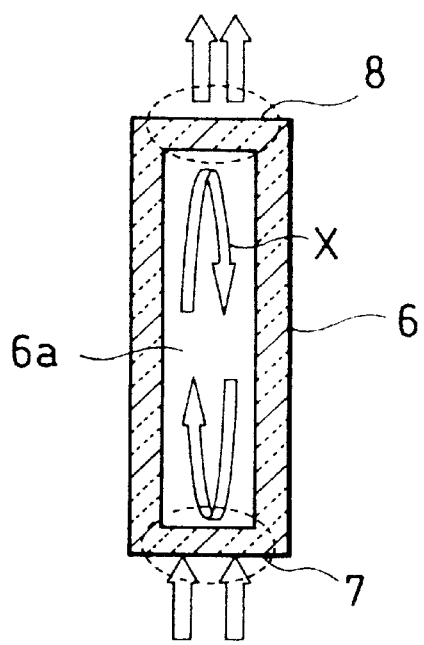

In such a simply closed container as mentioned above, as the container is heated at a heat receiving section 7, the heating medium undergoes convection in the direction indicated by arrows X shown in FIG. 4. As a result of the convection X, heat is transported by the heating medium from the heat receiving section 7 to a heat radiating section 8 of the container.

Figure 5:
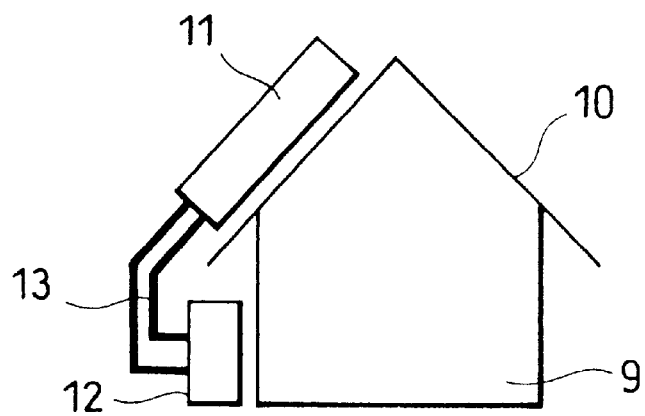
FIG. 5 illustrates an instance in which the invention is applied to a solar energy collector.

The heat carrier of the invention may be applied to various types of heat transfer systems as described below. FIG. 5 illustrates a solar energy collector 11 placed on a roof 10 of a house 9 for collecting solar energy from the sun. The heat collected by the solar energy collector 11 can be transported to a water heater 12 by a looped heat pipe 13, thereby heating the water in the water heater 12. The looped heat pipe 13 comprises a container connecting the solar energy collector 11 and the water heater 12, accommodating therein a heating medium such as carbon dioxide which becomes a supercritical fluid when in use.

Figure 6A:
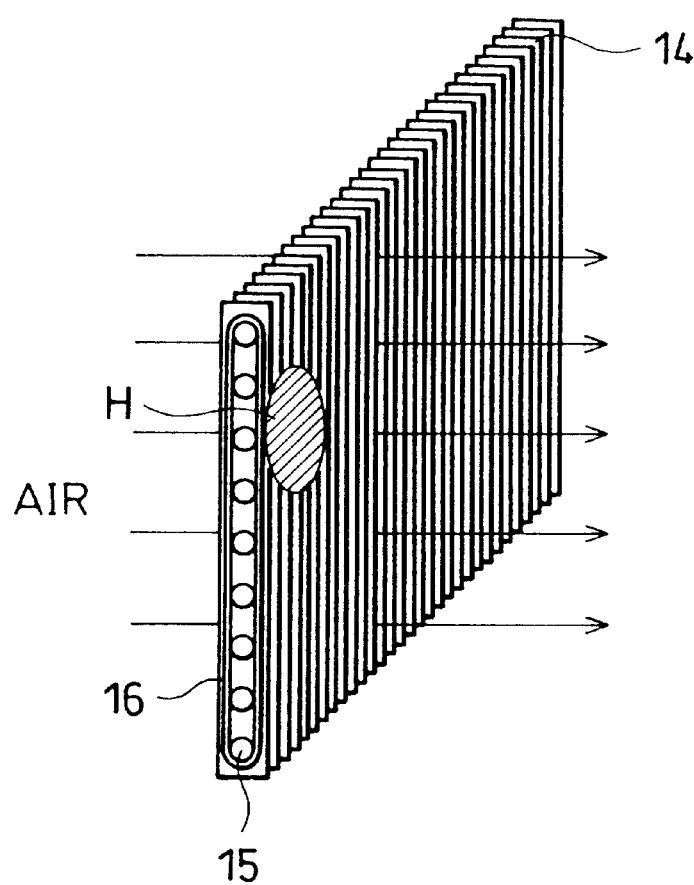
FIG. 6 illustrates an instance in which the invention is applied to a heat radiator having radiation fins, with FIG. 6A showing a perspective view of the radiator and FIG. 6B showing a side view.
Figure 6B:
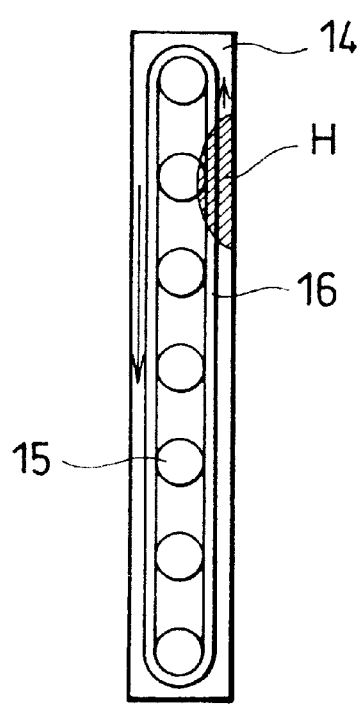

FIG. 6 illustrates an extended surface radiator, i.e. a heat radiator having a multiplicity of heat radiation fins 14. Connected with the fins 14 are a multiplicity of heat conductive tubes 15 penetrating the fins. A looped heat pipe 16 of the invention is mounted around the heat conductive tubes 15 in contact therewith.

In this arrangement, when the fins are locally heated at a portion H, for example, the heat is transported by the looped heat pipe 16 to other portions of the fins 14 to thereby effectively cool the heated portion H.

Figure 7:
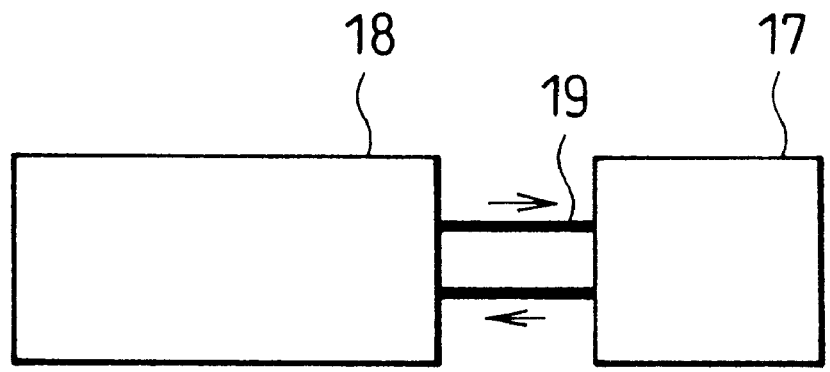
FIG. 7 illustrates an instance in which the invention is applied to a heat transfer system for transferring heat from a heat source to a heat utilization system.

FIG. 7 illustrates an instance in which heat liberated from a source of heat 17 such as a geothermal spots, a waste heat from a factory, or a boiler is transported by a looped heat pipe 19 to a heat utilization facility 18 such as a hot water supply system for good use of the heat. The looped heat pipe 19 may be covered with a heat insulator in order to minimize heat loss during the heat transfer.

Figure 8:
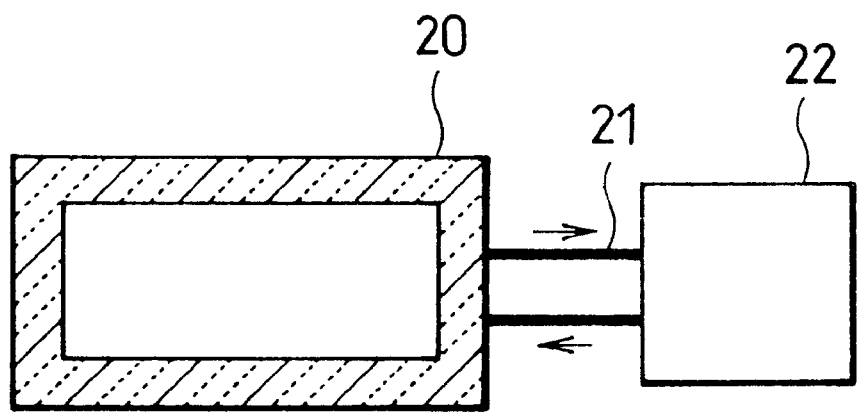
FIG. 8 illustrates an instance in which the invention is applied to a temperature controlled bath.

FIG. 8 illustrates an instance in which a temperature controlled bath 20 is connected with a heat source 22 by means of a looped heat pipe 21. The looped heat pipe 21 is designed to extend on the walls of the temperature controlled bath 20 so as to quickly transport heat from the heat source to the bath to maintain inside of the bath at a given temperature.

Figure 9:
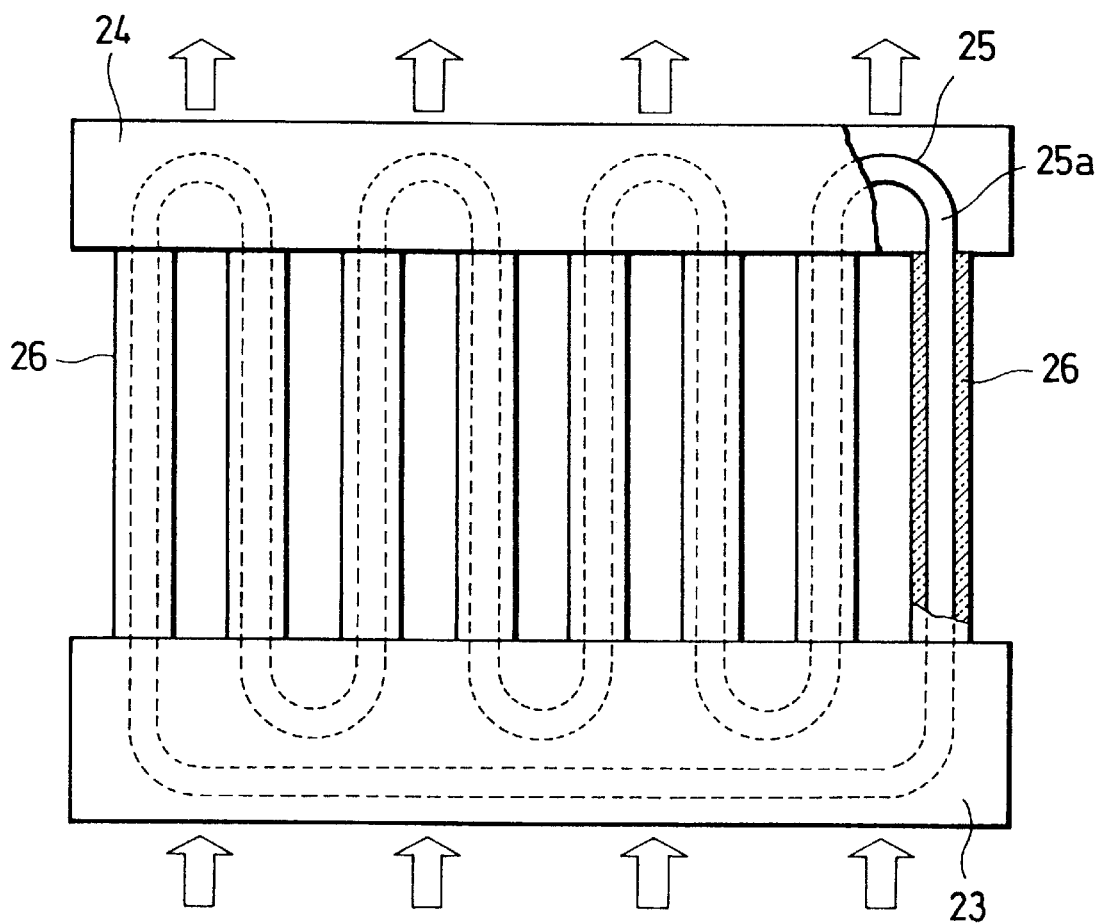
FIG. 9 is an example of a looped heat pipe zigzagging between a heat receiving section and a heat radiating section.

FIG. 9 illustrates an instance in which a portion of a looped heat pipe 25 zigzags between a heat receiving section 23 and a heat radiating section 24. The heat receiving section 23 is placed at a lower level than the heat radiating section 24 to allow convection of the supercritical heating medium inside the loop. The looped heat pipe 25 is covered with a heat insulator 26 to cut heat loss to the ambient air.

The inner space 25a of the looped heat pipe 25 is filled with carbon dioxide to serve as a supercritical heat transport medium. Once a heat difference is created between the heat receiving section 23 and the heat radiating section 24, the supercritical fluid begins to convect in the looped heat pipe 25, thereby effectively transporting heat from the heat receiving section 23 to the heat radiating section 24.

The use of such supercritical heating medium in a looped heat pipe can avoid a prior art problem that, if the gaseous heating medium is transformed to viscous liquid, the viscosity inhibits required convection of the medium, thereby resulting in poor heat transfer. Because of this efficient heat transfer by the supercritical heating medium, the inner diameter of the looped heat pipe can be reduced, so that the diameter of the looped heat pipe itself can be small. In addition, the supercritical fluid can be circulated through the looped heat pipe with a minimum energy, thereby enabling provision of an efficient heat carrier.

Figure 10:
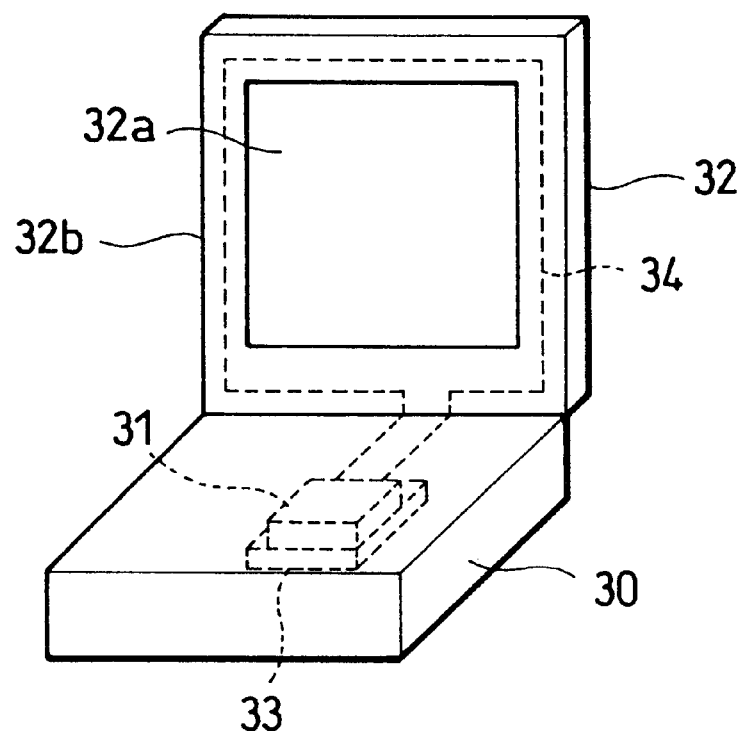
FIG. 10 illustrates an instance in which the invention is applied to a notebook PC.

The heat carrier of the invention may be used in a notebook type PC, as follows. FIG. 10 illustrates use of the heat carrier of the invention for cooling a CPU 31 controlling the entire operation of a notebook PC 30. In addition to the CPU 31, the computer further includes a display 32 having a display panel 32a embedded in a frame 32b. The CPU 31 is provided at the top end thereof with a heat receiving section 33 for absorbing heat generated in the CPU 31. The heat generated at the CPU 31 is transported by the heating medium through a looped heat pipe 34 disposed around the periphery of the display panel 32a, and is eventually liberated from the frame 32b serving as a part of a heat radiating section of the heat carrier. The closed inner space of the looped heat pipe 34 is reserved for the heating medium such as supercritical carbon dioxide for convection thereof, as in the foregoing examples. In this arrangement, the heating medium absorbs heat in the heat receiving section 33 and radiate it from the LCD panel 32a as the heating medium undergoes convection in the heat pipe around it. When the heating medium is carbon dioxide, it becomes a low-viscous supercritical fluid in the looped heat pipe 34 as the temperature of the heat receiving section 33, and hence carbon dioxide therein, exceeds 31° C. Accordingly, when the heat receiving section is heated by the CPU 31 to 31° C., convection takes place in the heat pipe due to a density gradient between the heat receiving section and the heat radiating section caused by the difference in temperature between them. As a result, heat is transported by the convection and is radiated from the periphery of the LCD panel 32a.

Figure 11:
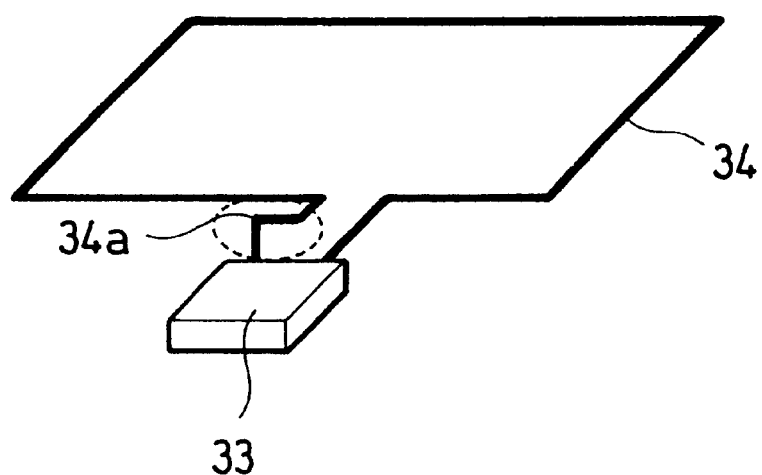
FIG. 11 illustrates a looped heat pipe for use in a notebook PC of FIG. 10.

Incidentally, in order to facilitate the convection of the heating medium by a density gradient created in the heating medium, an upward bend 34a may be provided in a portion of the looped heat pipe 34 proximate the heat receiving section 33 of the looped heat pipe 34, as shown in FIG. 11.

Figure 12:
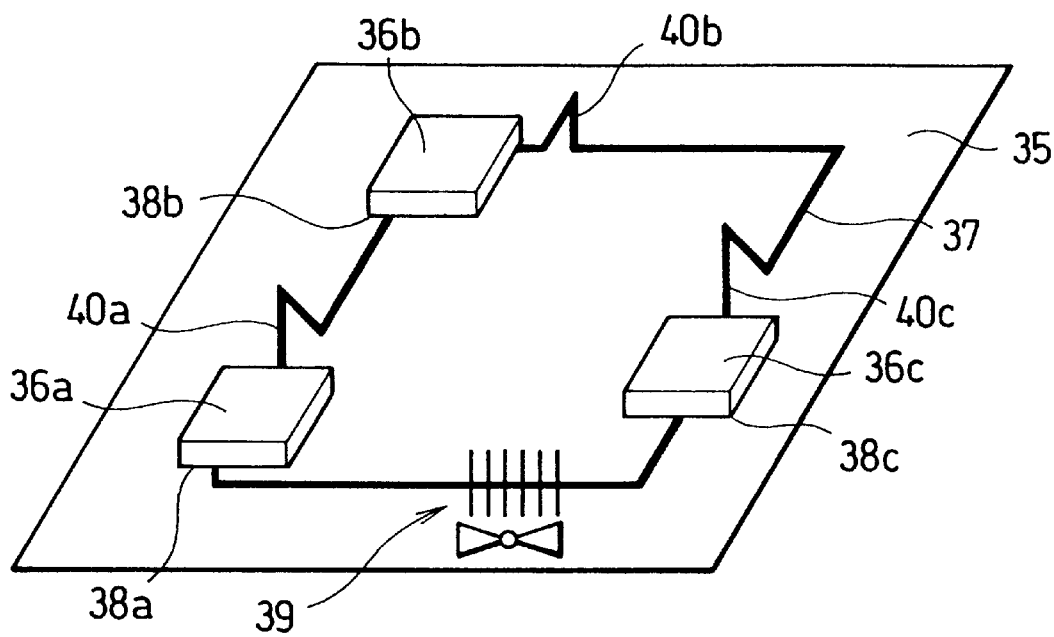
FIGS. 12–14 illustrate heat carriers of the invention as applied to a printed circuit board of a notebook PC in different manners, with FIG. 12 showing an instance in which the circuit board includes a multiplicity of heat generating elements.

FIG. 12 illustrates a printed circuit board 35 such as a mother board of a PC, for example, having a multiplicity of elements 36a–36c that generate heat.

In this instance, heat receiving sections 38a–38c of a looped heat pipe 37 are placed in contact with or close to the respective heat generating elements 36a–36c. These elements are thermally connected with a heat radiating section 39 away from the heat generating elements by the heat pipe. The looped heat pipe 37 may be provided with several bends 40a–40c near the heat receiving sections 38a–38c to facilitate the convection of the supercritical fluid as described in the foregoing example.

Heat extracted by the supercritical fluid is transported, through the heat pipe, from the respective heat generating elements 36a–36c to the heat radiating section 39 and radiated therefrom. It is noted that, in this instance, only one heat radiating section is provided in cooling multiple heat generating elements to save extra cost of, and space for, heat radiating sections that would be otherwise required.

Figure 13:
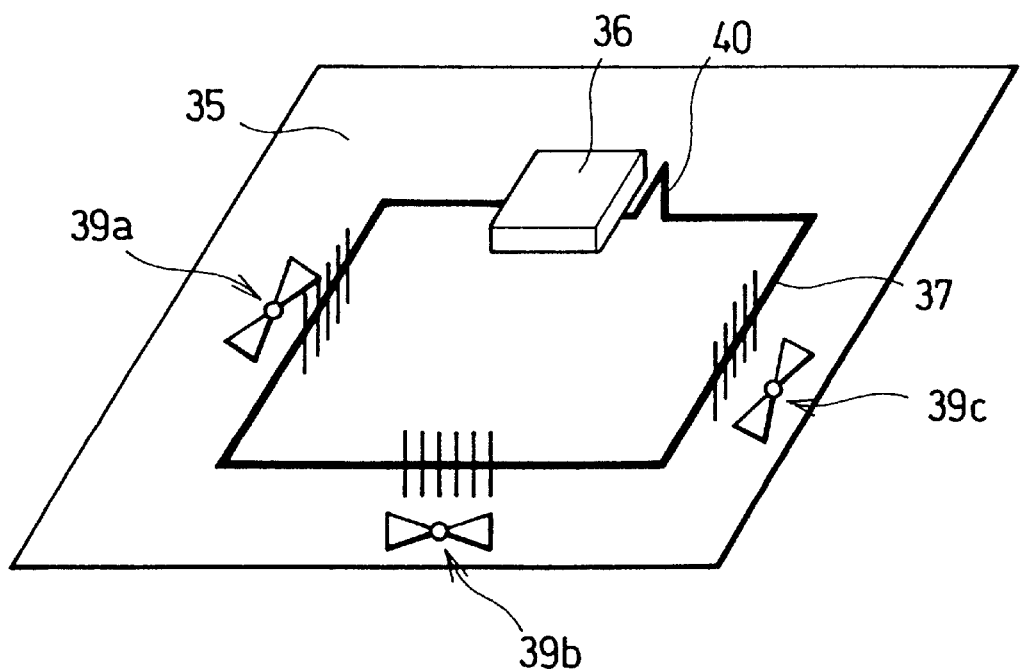

FIG. 13 illustrates an instance in which a multiplicity of heat radiating sections 39a–39c are provided for cooling a heat generating element 36 on a printed circuit board 35.

It is noted that, in this example, heat generating elements can be desirably cooled by means of the multiple heat radiating sections each having a smaller heat capacity and hence occupying a smaller space.

Figure 14:
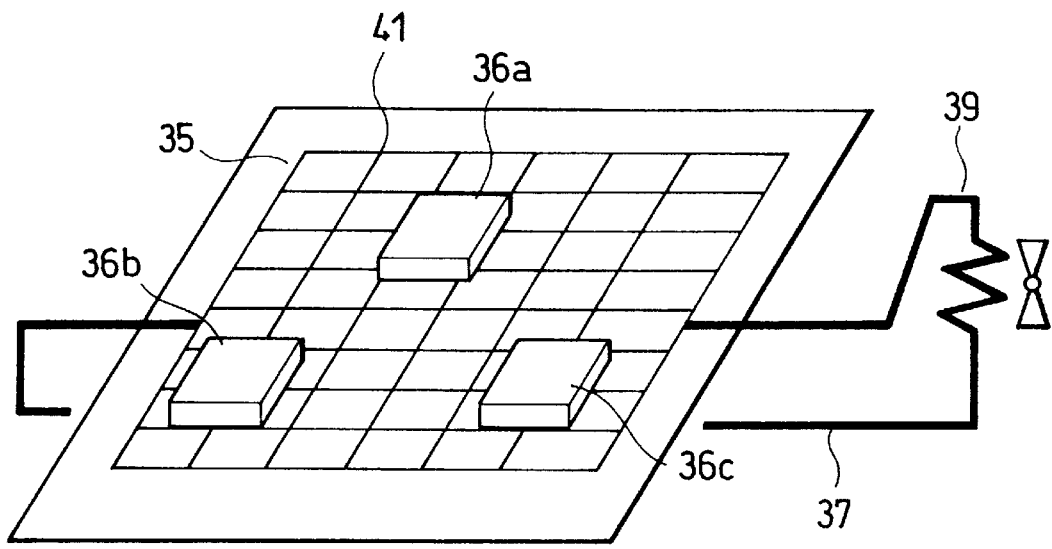

FIG. 14 illustrates a looped heat pipe 37 having a multiplicity of branches distributed over a printed circuit board 35 of a PC and connected together so as to function as a planar heat receiving section 41 for cooling a multiplicity of heat generating elements 36a–36c distributed on the printed circuit board 35.

It is noted that the planar heat receiving section 41 shown in FIG. 14 has branches in a checkerboard pattern in contact with or extending close to the heat generating elements 36 on the printed circuit board 35 so as to absorb heat therefrom. In stead of forming the looped heat pipe 37 in such a checkerboard pattern, the heat pipe may be formed of a planar array of parallel branches.

When the heating medium is a supercritical fluid, due to low viscosity, fluid resistance in the branches is low, so that heat pipes in the heat receiving section 41 can be thinner than the rest of the looped heat pipes 37. Hence, portable PCs for example can be thin and light weighted.

When the heat generating elements 36 are heated above a certain temperature, 50° C. say, the supercritical fluid in the looped heat pipe 37 begins to circulate therein transporting heat from the heat receiving section 41 to the heat radiating section 39, thereby cooling the heat receiving section 41.

Figure 15:
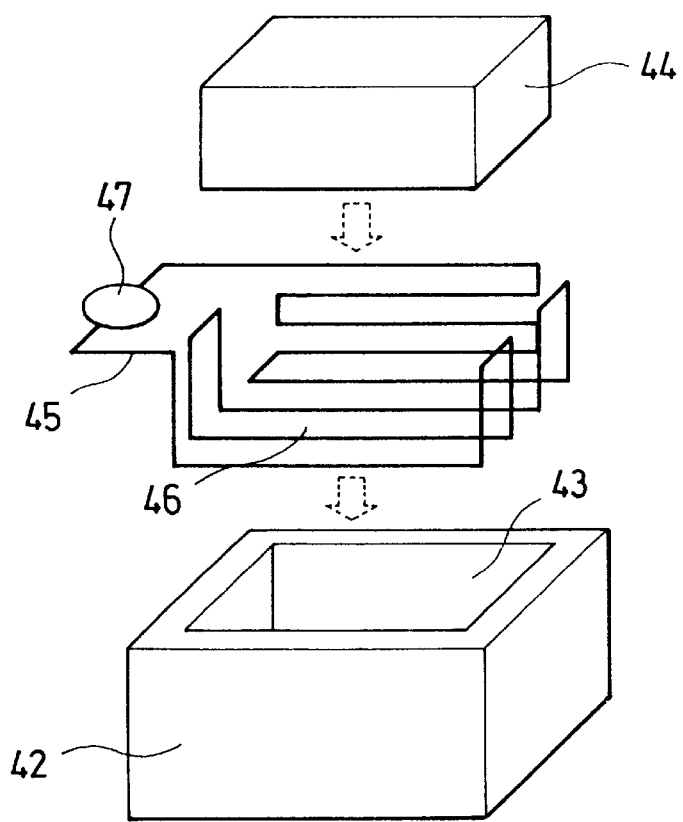
FIG. 15 is a perspective view of a heat carrier as applied to an electronic appliance such as a notebook PC, showing a looped heat pipe arranged to follow the profile of the appliance.

FIG. 15 illustrates an instance in which a heat receiving section 46 of a heat pipe is configured to spread over the profile of an object 44 to be cooled. A container 42 has a recess 43 for accommodating therein the parallelepiped object 44, which can be an electronic component of a PC for example. The heat receiving section 46 of a looped heat pipe 45 is formed to spread over the profile of the object 44 so that the heat receiving section 46 can be placed in the recess 43 together with the object 44. The heat radiating section 47 of the looped heat pipe is placed outside the container 42.

It should be noted that in the example shown herein circulation of the supercritical fluid is not prevented by the bends of the heat pipe because of low viscosity of the supercritical fluid. Rather, the convection is facilitated by several upward bends, resulting in more effective heat transport to the heat radiating section 47.

Those skilled in the art will recognize that other alternative embodiments comprising variations on these heat carriers could also be contemplated. For example, several features of the examples shown may be appropriately combined.

What we claim is:

1. A heat carrier comprising:
    a closed container for accommodating therein a heating medium, said container having at least one heat receiving section and at least one heat radiating section, wherein
    said heating medium is transformed into a supercritical fluid when it is heated and undergoes convection due to a difference in temperature between said heat receiving section and said heat radiating section, thereby carrying heat from said heat receiving section to said heat radiating section;
    wherein said container is a looped pipe connecting said heat receiving section and said heat radiating section;
    wherein said looped pipe in said heat receiving section(s) has a planar mesh configuration; and
    wherein said looped pipe has a smaller diameter in said heat receiving section(s) as compared with the rest of said pipe;
    whereby a heat transfer between the heat receiving section and the heat radiating section is desirably balanced.

2. The heat carrier according to claim 1, wherein said heating medium is carbon dioxide.

3. The heat carrier according to claim 1, wherein said looped pipe is provided with at least one upward bend.

4. The heat carrier according to claim 1, wherein said looped pipe is covered with a heat insulator except at said heat receiving section and said heat radiating section.

5. The heat carrier according to claim 1, wherein said looped pipe has more than one heat radiating section.

6. The heat carrier according to claim 1, wherein said looped pipe is provided with more than one heat receiving section and one heat radiating section.

7. The heat carrier according to claim 1, wherein said looped pipe in said heat receiving section(s) is disposed along the profile of an object that includes the heat receiving section(s).

8. The heat carrier according to claim 7, wherein said heating medium is carbon dioxide.

9. The heat carrier according to claim 7, wherein the object is a printed circuit board, whereby the heat receiving section(s) cools a multiplicity of heat generating elements on the printed circuit board.

10. The heat carrier according to claim 1, comprising in combination the heat carrier and a notebook computer;
    the notebook computer comprising a CPU and a display;
    the heat carrier comprising:
        a closed container for accommodating therein a heating medium, said container having at least one heat receiving section and at least one heat radiating section, wherein
        said heating medium is transformed into a supercritical fluid when it is heated and undergoes convection due to a difference in temperature between said heat receiving section and said heat radiating section, thereby carrying heat from said heat receiving section to said heat radiating section;
        wherein said container is a looped pipe connecting said heat receiving section and said heat radiating section; and
        wherein said at least one heat receiving section is in thermal contact with the CPU and said at least one heat radiating section is in thermal contact with the display.

11. The heat carrier according to claim 1, wherein the heat radiating section is diposed around a border of the display.

12. A heat carrier comprising:
    a closed container for accommodating therein a heating medium, said container having at least one heat receiving section and at least one heat radiating section, wherein
    said heating medium is transformed into a supercritical fluid when it is heated and undergoes convection due to a difference in temperature between said heat receiving section and said heat radiating section, thereby carrying heat from said heat receiving section to said heat radiating section;
    wherein said container is a looped pipe connecting said heat receiving section and said heat radiating section;
    wherein said heat receiving section is at a lower level than said heat radiating section; and
    wherein said heat radiating section further includes a portion zigzagging between said heat receiving section and said heat radiating section.

13. The heat carrier according to claim 12, wherein said heating medium is carbon dioxide.

* * * * *